(12) United States Patent
Ueda

(10) Patent No.: US 6,379,056 B1
(45) Date of Patent: Apr. 30, 2002

(54) SUBSTRATE PROCESSING APPARATUS

(75) Inventor: Issei Ueda, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/660,489

(22) Filed: Sep. 12, 2000

(51) Int. Cl.[7] .......................... G03D 5/00; B65G 49/07
(52) U.S. Cl. .................. 396/611; 118/52; 118/326; 414/940; 29/25.01
(58) Field of Search ................ 396/611; 355/30, 355/27; 118/52, 54, 56, 500, 716, 326, 300; 414/225, 416, 935–941; 29/25.01

(56) References Cited

U.S. PATENT DOCUMENTS

| | | | |
|---|---|---|---|
| 5,639,301 A | * 6/1997 | Sasada et al. | 118/52 |
| 5,928,390 A | 7/1999 | Yaegagashi et al. | 29/25.01 |
| 5,942,013 A | 8/1999 | Akimoto | 29/25.01 |
| 5,944,894 A | 8/1999 | Kitano et al. | 118/326 |
| 5,960,225 A | 9/1999 | Fujimoto | 396/611 |
| 6,097,469 A | * 8/2000 | Yaegashi et al. | 396/611 |
| 6,215,545 B1 | * 4/2001 | Matsuyama | 396/611 |
| 6,224,274 B1 | * 5/2001 | Matsuyama | 396/611 |

* cited by examiner

Primary Examiner—D Rutledge
(74) Attorney, Agent, or Firm—Rader, Fishman & Grauer, PLLC

(57) ABSTRACT

A first processing unit group for performing processing for a substrate at a temperature close to room temperature and a second processing unit group for performing heat processing for the substrate are disposed in divided different areas. Between the first processing unit group and the second processing unit group, the substrate is transferred only by means of a main transport apparatus and not directly. Thereby, temperature control can be precisely performed in the first processing unit group for performing processing for the substrate at a temperature close to room temperature.

14 Claims, 14 Drawing Sheets

SUBSTRATE PROCESSING APPARATUS

BACKGROUND OF THE INVENTION

1. Field of the Invention

The present invention relates to a technical field of, for example, semiconductor device fabrication.

2. Description of the Related Art

In a photoresist step in a process of semiconductor device fabrication, for example, a resist solution is applied to a front face of a semiconductor wafer (hereinafter, referred to as "wafer") or the like to form a resist film, and a developing solution is supplied to the wafer which has been exposed in a pattern to thereby perform developing processing. In order to perform the above-described series of processing, a coating and developing processing apparatus has been conventionally used.

The coating and developing apparatus comprises various kinds of processing units such as a cooling processing unit for cooling a wafer, a heat processing unit for heating the wafer, a resist coating unit for coating the wafer with a resist solution, a developing processing unit for performing developing processing for the wafer, and the like. In order to make the whole coating and developing processing apparatus compact, a thermal processing unit group is formed in which a plurality of heat processing units and cooling processing units are multi-tiered in a mixed manner. In this case, the heat processing units are disposed at the upper tier and the cooling processing units are disposed at the lower tier in the thermal processing unit group respectively, thereby preventing thermal interference in the thermal processing unit group. Further, in the coating and developing processing apparatus, the thermal processing unit group is disposed near the resist coating unit and the developing processing unit to be compactly arranged with a transport apparatus, thereby attaining further space saving of the coating and developing processing apparatus.

However, as the wafer increases in diameter, all the processing units increase in size. Thus, it is necessary to arrange the processing units more compactly in order to save space.

However, when the heat processing unit increases in size, an amount of heat of the heat processing unit also increases. Accordingly, in the case where the heat processing unit is disposed near other processing units as one processing unit in the thermal processing unit group as before, there is a danger that temperature control can not be precisely performed in the other units for performing processing for the wafer at a temperature close to room temperature, for example, the resist coating unit, the cooling processing unit, and the like. The instabilities in temperature control in these processing units result in a problem of a resist film varying in film thickness.

SUMMARY OF THE INVENTION

The present invention is made under the circumstances and its object is to provide a substrate processing apparatus capable of precisely performing temperature control in a processing unit for performing processing for a substrate at a temperature close to room temperature.

To solve the above problem, according to a first aspect of the present invention, a substrate processing apparatus, comprising: a first processing unit group including a plurality of first processing units for performing processing for a substrate at a temperature close to room temperature; a second processing unit group including a plurality of second processing units for performing heat processing for the substrate; and a main transport apparatus for transporting the substrate between the units, wherein the first processing unit group and the second processing unit group are disposed in divided different areas, and the substrate is transferred between the first processing unit group and the second processing unit group only by means of the main transport apparatus, is provided.

According to the above configuration, the first processing unit group for performing processing for the substrate at a temperature close to room temperature and the second processing unit group for performing heat processing for the substrate are disposed in divided different areas, thereby minimizing thermal interference which the first processing unit group receives from the second processing unit group. In addition, in the present invention, the substrate is not directly transferred between the first processing unit group and the second processing unit group but transferred only by means of the main transport apparatus, thereby reducing the flow of a temperature atmosphere in the second processing unit group into the first processing unit group to a minimum. Consequently, according to the present invention, temperature control in the first processing unit group for performing processing for the substrate at a temperature close to room temperature can be precisely performed.

According to a second aspect of the present invention, a substrate processing apparatus, comprising: a transfer table for transferring a substrate; a first transport apparatus and a second transport apparatus, disposed in front and behind the transfer table to hold it therebetween, for transporting the substrate; a cooling processing unit, disposed to hold the fist transport apparatus between the cooling processing unit and the transfer table, for performing cooling processing for the substrate; a processing solution supply unit, disposed on a side of the first transport apparatus, for supplying a processing solution to the substrate; and heat processing unit, disposed on a side of the second transport apparatus, for performing heat processing for the substrate, is provided.

According to the above configuration, the apparatus is divided into the first area, including the cooling processing unit and the processing solution supply unit, for performing processing for the substrate at a temperature close to room temperature and the second area, including the heat processing unit, for performing heat processing for the substrate with the transfer table therebetween, and the first area and the second area can be separated by at least a width of the transfer table, thereby minimizing thermal interference which the processing solution supply unit and the cooling processing unit for performing processing for the substrate at a temperature close to room temperature in the first area receive from the second area including the heat processing unit. Consequently, temperature control in the processing solution supply unit and the cooling processing unit for performing processing for the substrate at a temperature close to room temperature can be precisely performed. Further, the processing units and the like can be arranged on all four sides around the first transport apparatus, and the processing units and the like can be arranged on three sides around the second transport apparatus and the remaining one side can be used for transfer of the substrate to/from the outside, so that the processing units and the like can be densely arranged. Consequently, space savings can be realized.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
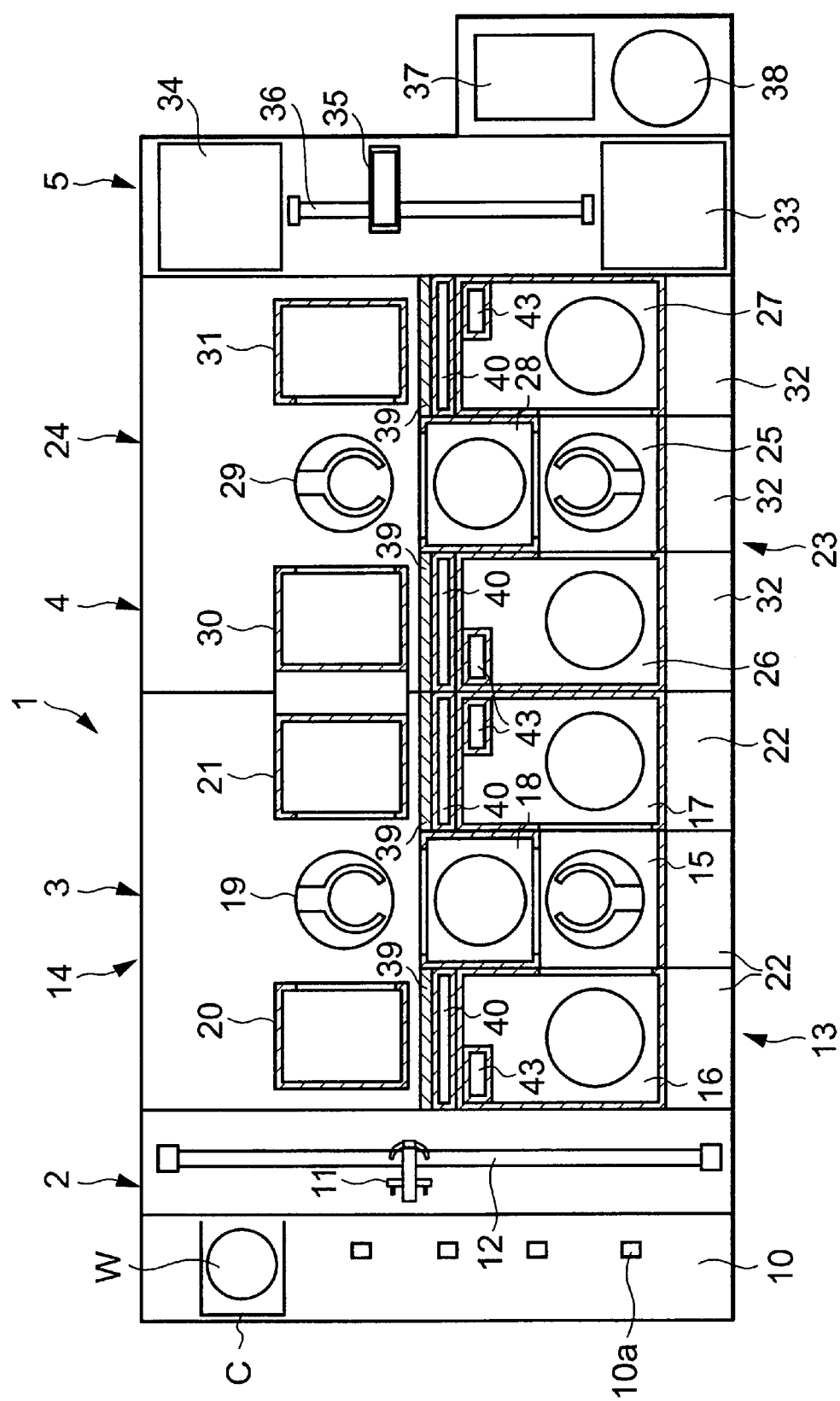
FIG. 1 is a plan view showing a coating and developing processing system according to a first embodiment of the present invention.
Figure 2:
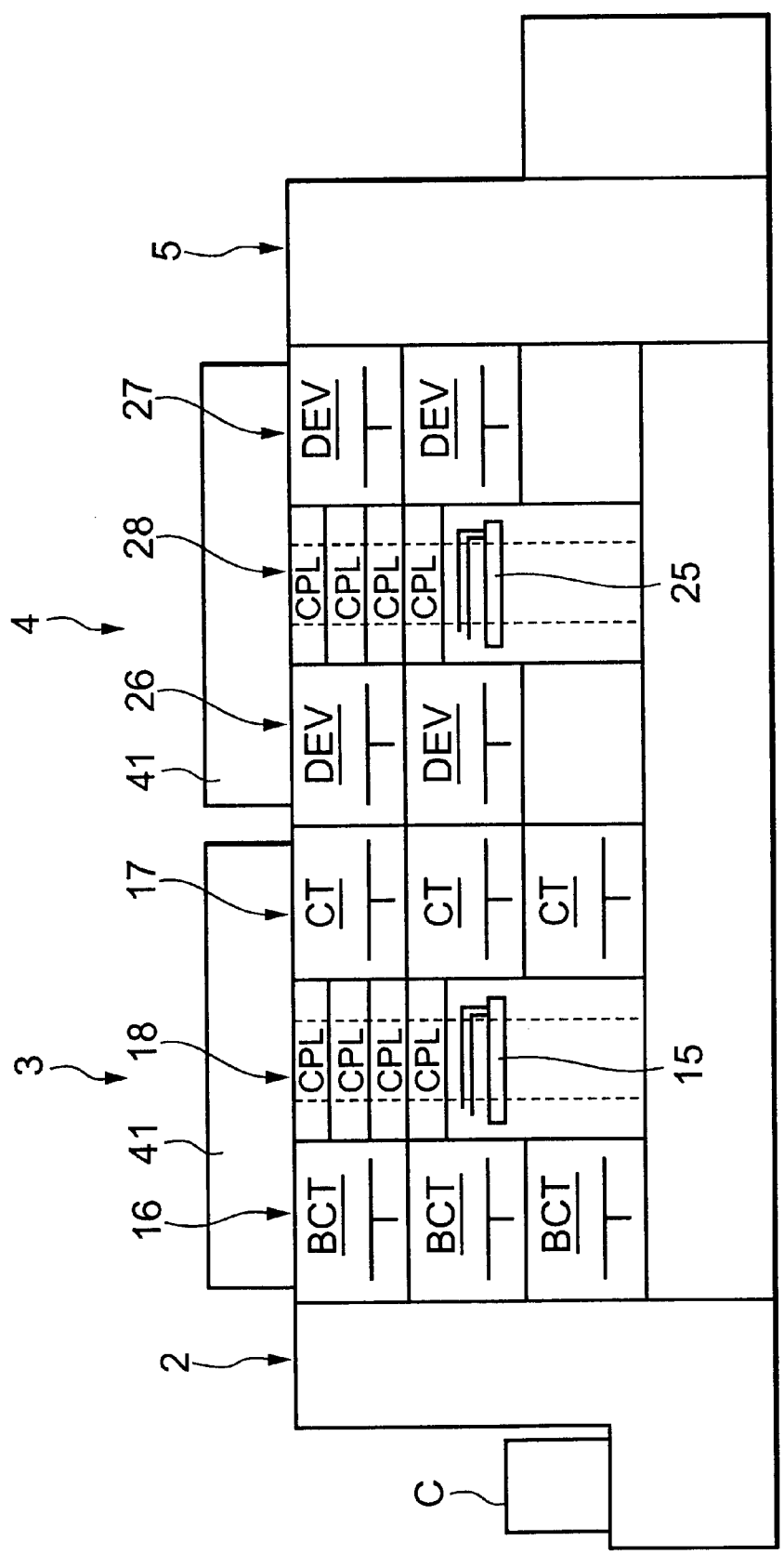
FIG. 2 is a front view of the coating and developing processing system shown in FIG. 1.
Figure 3:
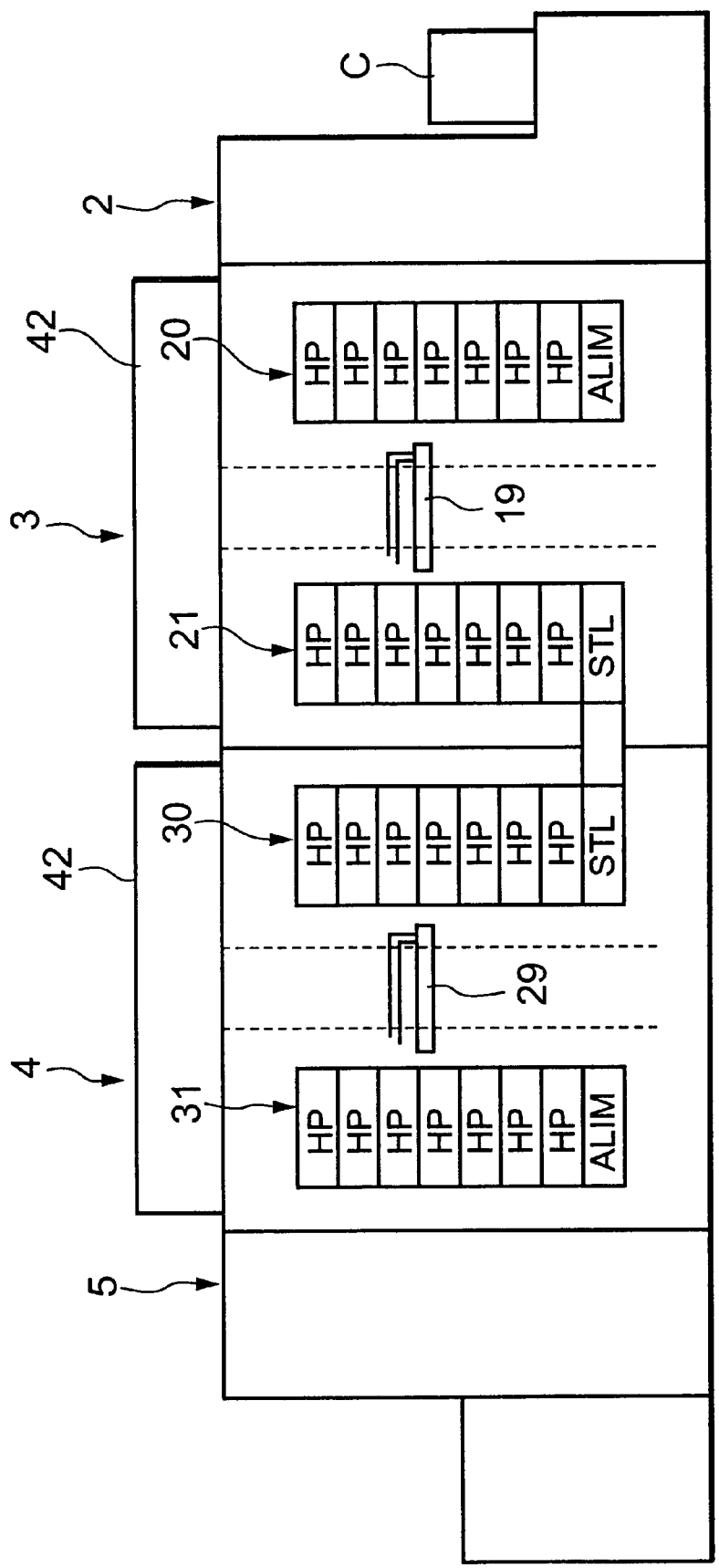
FIG. 3 is a rear view of the coating and developing processing system shown in FIG. 1.
Figure 4:
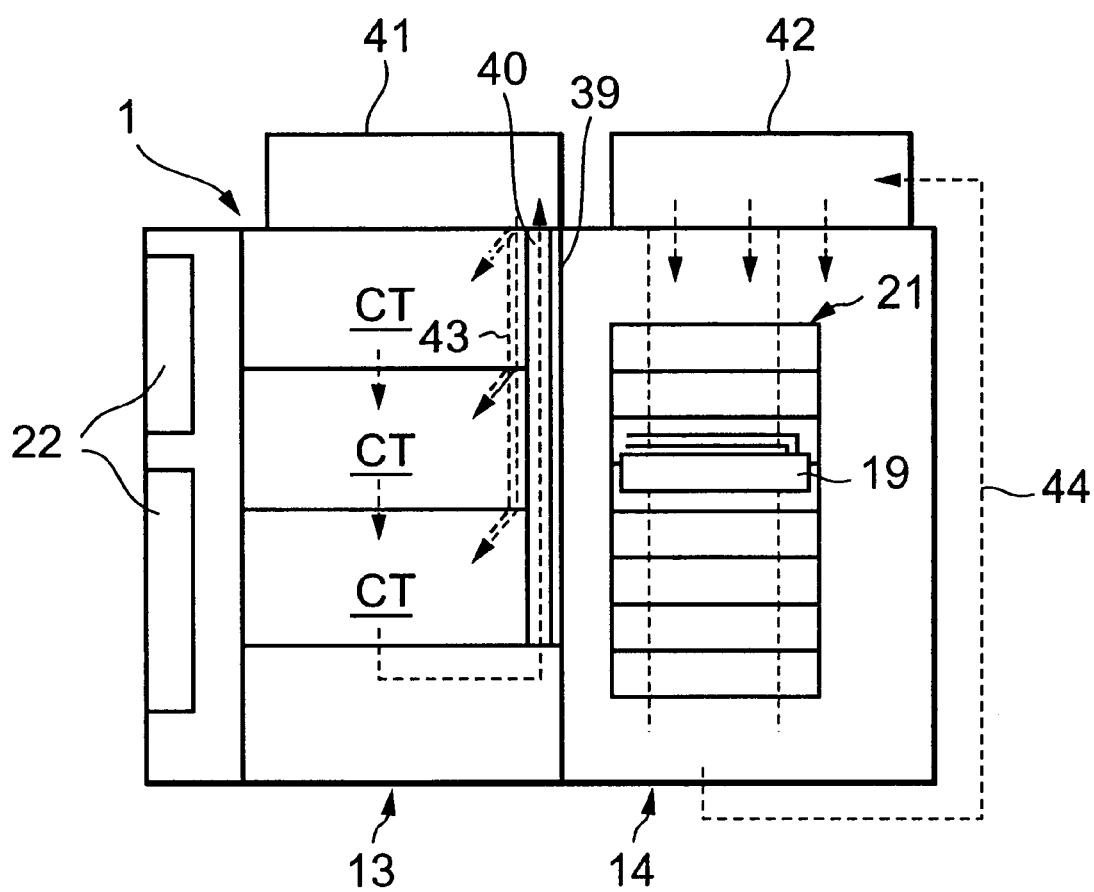
FIG. 4 is a side view of the coating and developing processing system shown in FIG. 1.

Hereinafter, a first embodiment of the present invention will be described with reference to the accompanying drawings. FIG. 1 to FIG. 4 are views showing a coating and developing processing system according to the first embodiment, FIG. 1 is a plan view, FIG. 2 is a front view, FIG. 3 is a rear view, and FIG. 4 is a side view.

A shown in FIG. 1, the coating and developing processing system 1 has a structure in which a cassette station 2 for transferring, for example, 25 wafers W, as a unit, from/to the outside into/from the coating and developing processing system 1 and carrying the wafer W into/out of a cassette C, a first processing station 3 in which various kinds of processing units each for performing predetermined processing for the wafers W one by one in coating and developing processing steps are multi-tiered, a second processing station 4 disposed adjacent to the first processing station and having almost the same structure as that of the first processing station, and an interface section 5 for transferring the wafer W to/from an aligner (illustration thereof is omitted) disposed adjacent to the second processing station 4 are integrally connected.

In the cassette station 2, a plurality of cassettes C can be mounted with respective wafer transfer ports facing the processing station 3 side at positions of positioning projections 10a on a cassette mounting table 10 in a line along an X-direction (a vertical direction in FIG. 1). A wafer transport body 11 movable in the direction of arrangement of cassettes C (the X-direction) and in the direction of arrangement of wafers W housed in the cassette C (a Z-direction: a vertical direction) can freely move along a transport path 12 and selectively gets access to each of the cassettes C.

The wafer transport body 11 is structured to be rotatable in a θ-direction so as to be accessible to an alignment unit in the first processing station 3 described later.

In the first processing station 3, a first processing unit group 13 having a plurality of first processing units each for performing processing for the wafer W at a temperature close to room temperature is disposed on the front side, and a second processing unit group 14 having a plurality of second processing units each for performing heat processing for the wafer W is disposed on the rear side. In other words, the first processing unit group 13 and the second processing unit group 14 are arranged in divided different areas.

In the first processing unit group 13, an anti-reflection film coating unit group 16, a resist film coating unit group 17, and a cooling processing unit group 18 are arranged around a vertical transport-type secondary wafer transport apparatus 15 described later. The anti-reflection film coating unit group 16 is disposed on the cassette station 2 side, the resist film coating unit group 17 is disposed on the second processing station 4 side, and the cooling processing unit group 18 is disposed to face a main transport apparatus 19 described later in the second processing unit group 14 respectively.

In the second processing unit group 14, a first thermal processing unit group 20 and a second thermal processing unit group 21 are arranged around the main transport apparatus 19. The first thermal processing unit group 20 is disposed on the cassette station 2 side, and the second thermal processing unit group 21 is disposed on the second processing unit group 4 side respectively.

Further, vessel shelves 22 as areas for housing vessels which store processing solutions used in the first processing unit group 13, for example, a resist solution and an anti-reflection film solution are provided on the front side adjacent to the area in which the first processing unit group 13 is disposed and opposite to the area in which the second processing unit group 14 is disposed. The vessel shelf 22 has a structure like a door that can be opened and closed, for example, to the front side, and the vessels can be housed in the door. This facilitates replacement of vessels and maintenance and checks.

In the second processing station 4, as in the first processing station 3, a first processing unit group 23 having a plurality of first processing units each for performing processing for the wafer W at a temperature close to room temperature is disposed on the front side, and a second processing unit group 24 having a plurality of second processing units each for performing heat processing for the wafer W is disposed on the rear side. In other words, the first processing unit group 23 and the second processing unit group 24 are arranged in divided different areas.

In the first processing unit group 23, a first developing processing unit group 26, a second developing processing unit group 27, and a cooling processing unit group 28 are arranged around a vertical transport-type secondary wafer transport apparatus 25 described later. The first developing processing unit group 26 is disposed on the first processing station 3 side, the second developing processing unit group 27 is disposed on the interface section 5 side, and the cooling processing unit group 28 is disposed to face a main transport apparatus 29 described later in the second processing unit group 24 respectively.

In the second processing unit group 24, a first thermal processing unit group 30 and a second thermal processing unit group 31 are arranged around the main transport apparatus 29. The first thermal processing unit group 30 is disposed on the first processing station 3 side, and the second thermal processing unit group 31 is disposed on the interface section 5 side respectively.

Further, vessel shelves 32 as areas for housing vessels which store a processing solution used in the first processing unit group 23, for example, a developing solution are provided on the front side adjacent to the area in which the first processing unit group 23 is disposed and on the opposite side to the area in which the second processing unit group 24 is disposed. The vessel shelf 32 has the same structure as that of the vessel shelf 22.

In the interface section 5, a buffer cassette 33, having the same structure, for example, as that of the cassette C, for temporarily holding the wafer before exposure is disposed on the front face side thereof, and an edge aligner 34 is disposed on the rear face side thereof. A wafer transport body 35 which is ascendable and descendable in the vertical direction and rotatable in the θ-direction can move along a transport path 36 between the buffer cassette 33 and the edge aligner 34. The wafer transport body 35 is configured to get access to an alignment unit described later in the second processing station 4, the above-described buffer cassette 33 and edge aligner 34, and a pre-exposure cooling unit 37 described later.

Further, in the interface section 5, the pre-exposure cooling unit 37 for cooling the wafer W before exposure is disposed between the buffer cassette 33 and the like and the aligner of which the illustration is omitted. Furthermore, a wafer transport body 38 which is ascendable and descendable and rotatable in the θ-direction is disposed to be accessible to the pre-exposure cooling unit 37, an in-stage and out-stage (illustration thereof is omitted) in the aligner, and the aforesaid buffer cassette 33. It should be noted that the pre-exposure cooling unit 37 cools the wafer W by a chill plate in which only Peltier elements are embedded as cooling means, whereby the wafer W can be cooled to a precise temperature before exposure.

In the coating and developing processing system 1, heat insulation walls 39 and passages 40 described later for circulating gas exhausted from the bottom portions of the first processing unit groups 13 and 23 to the upper portions thereof are arranged between the first processing unit group 13 (the anti-reflection film coating unit group 16 and the resist film coating unit group 17) and the second processing unit group 14 in the first processing station 3, and between the first processing unit group 23 (the first developing unit group 26 and the second developing unit group 27) and the second processing unit group 24 in the second processing station 4 respectively. In other words, the heat insulation walls 39 and the passages 40 are arranged to divide the first processing unit groups 13 and 23 from the second processing unit groups 14 and 24.

As shown in FIG. 2, in the aforesaid anti-reflection film coating unit group 16, anti-reflection film coating units (BCT) for applying an anti-reflection film on the wafer W while the wafer W is mounted on a spin chuck in a cup to thereby perform anti-reflection film coating processing for the wafer W are three-tiered.

In the resist coating unit group 17, resist coating units (CT) for applying a resist solution on the wafer W while the wafer W is mounted on a spin chuck in a cup to thereby perform resist coating processing for the wafer W are three-tiered.

In the cooling processing unit group 18, cooling processing units (CPL) are four-tiered. Incidentally, the structure of the cooling processing unit (CPL) is described later.

In the first developing processing unit group 26, developing processing units (DEV) for supplying a developing solution to the wafer W while the wafer W is mounted on a spin chuck in a cup to thereby perform developing processing for the wafer W are two-tiered from the top.

Also in the cooling processing unit group 28, cooling processing units (CPL) are four-tiered. Incidentally, the structure of the cooling processing unit (CPL) is described later.

As shown in FIG. 3, in the first thermal processing unit group 20 in the first processing station 3, an alignment unit (ALIM) for performing alignment of the wafer W and seven heat processing units (HP) for performing heat processing for the wafer W are, for example, eight-tiered from the bottom in order. In the second thermal processing unit group 21 in the first processing station 3, a transfer unit (STL) for performing transfer of the wafer W to/from the second processing station 4 and seven heat processing units (HP) are, for example, eight-tiered from the bottom in order. Incidentally, the structure of the transfer unit (STL) is described later.

In the first thermal processing unit group 30 in the second processing station 4, a transfer unit (STL) and seven heat processing units (HP) are, for example, eight-tiered from the bottom in order. In the second thermal processing unit group 31 in the second processing station 4, an alignment unit (ALIM) and seven heat processing units (HP) are, for example, eight-tiered from the bottom in order.

As shown in FIG. 4, a first clean air supply section 41 for supplying temperature-controlled clean air from the top to the first processing unit group 13 of the first processing station 3 and a second clean air supply section 42 for supplying clean air from the top to the second processing unit group 14 of the first processing station 3 are disposed at the top portion of the coating and developing processing system 1.

The first clean air supply section 41 includes an FFU (a fan and filter unit), a temperature controller for controlling temperature and humidity, and the like, and supplies clean air, which is gas flowing thereinto through the passage 40 for circulating gas exhausted from the bottom portion of the first processing unit group 13 to the top portion thereof and controlled in temperature and humidity, and particles and the like are eliminated therefrom, to each of the coating processing units (BCT, CT) through a passage 43. The passage 40 also functions as a heat insulator as described later. The gas exhausted from the bottom portion of the first processing unit group 13 is warmed by passing through the passage 40. Thus, in this embodiment, clean air which is temperature-controlled in the clean air supply section 41 by mixing new gas with a temperature lower than the temperature of the air supplied to each of the coating processing units (BCT, CT) and the gas which has been exhausted from the bottom portion of the first processing unit group 13 and passed through the passage 40 is supplied to each of the coating processing units (BCT, CT).

Meanwhile, the second clean air supply section 42 includes an FFU (a fan and filter unit) and the like and supplies clean air, which is gas flowing thereinto through a passage 44 for circulating gas exhausted from the bottom portion of the second processing unit group 14 to the top portion thereof and particles and the like are eliminated therefrom, to each heat processing unit (HP).

Similarly, also in the second processing station 4, a first clean air supply section 41 for the first processing unit group 23 and a second clean air supply section 42 for the second processing unit group 24 are separately provided.

It is necessary to control temperature to room temperature in the first processing unit groups 13 and 23, whereas such temperature control is unnecessary in the second processing unit groups 14 and 24. Accordingly, supply of clean air to the first processing unit groups 13 and 23 and supply of clean air to the second processing unit groups 14 and 24 are separately performed, and only the clean airs to the first processing unit groups 13 and 23 are temperature-controlled, whereby cost of the temperature controller can be reduced, and more than that, the temperature control to the first processing unit groups 13 and 23 can be performed more precisely.

It should be noted that in the first processing unit groups 13 and 23, humidity management is necessary in addition to temperature management in the coating system of units, whereas humidity management is unnecessary in the cooling processing units. Thus, means for supplying clean air to the coating system of units and means for supplying clean air to the cooling processing units are separately provided, and only the clean air to the coating system of units is humidity-controlled, thereby further reducing cost of the temperature controller and enhancing effects in the precise temperature control.

Figure 5:
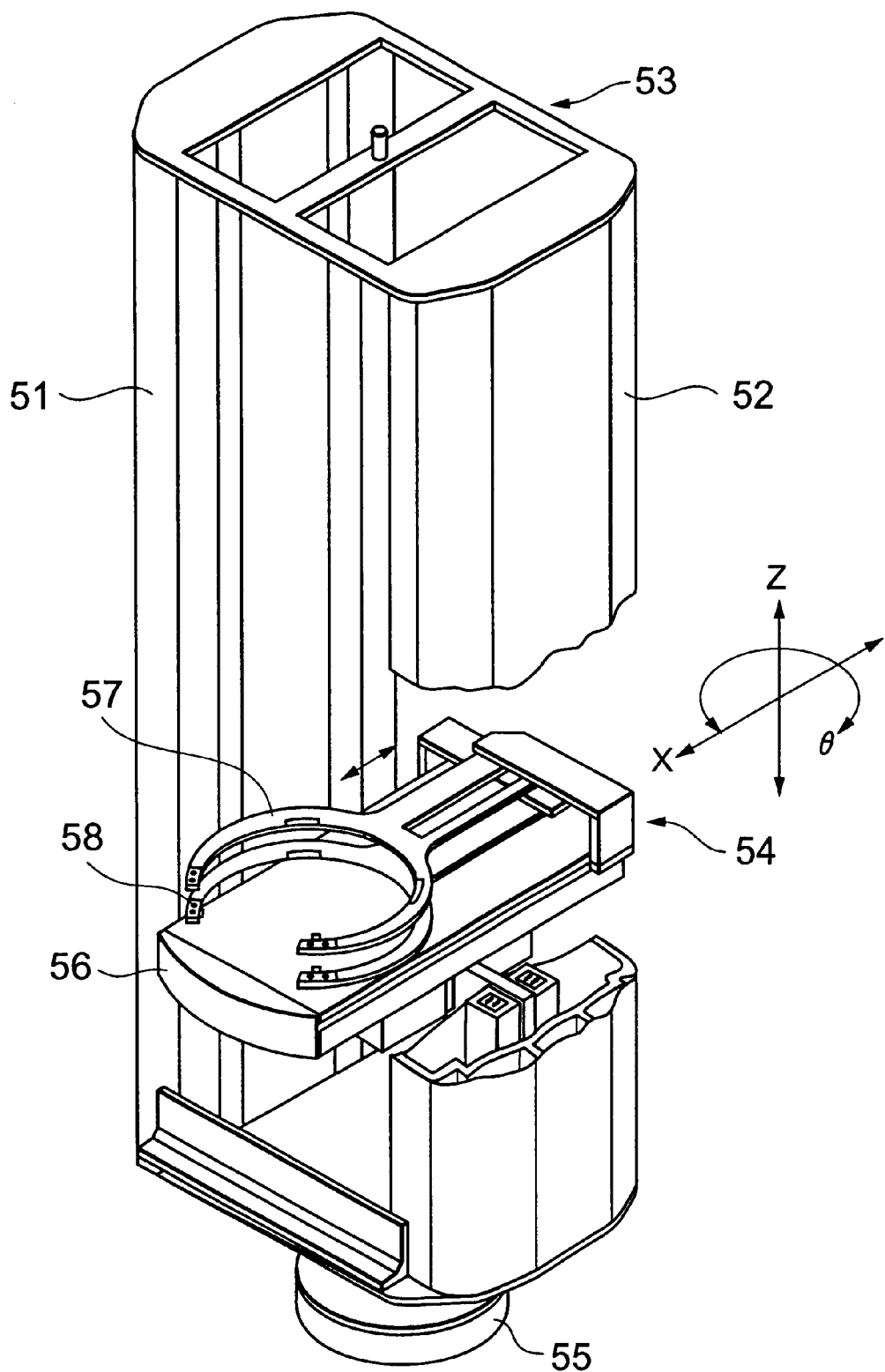
FIG. 5 is a perspective view showing the structure of a main transport apparatus and a secondary transport apparatus shown in FIG. 1.

The aforesaid main transport apparatuses 19 and 29 and the aforesaid secondary transport apparatuses 15 and 25 basically have the same structure including wafer transport means 54 which is ascendable and descendable in the vertical direction (the Z-direction) inside a cylindrical supporter 53 composed of a pair of wall portions 51 and 52 which are connected with each other at respective upper ends and lower ends and face each other as shown in FIG. 5. The cylindrical supporter 53 is connected to a rotating shaft of a motor 55 and rotates integrally with the wafer transport means 54 around the aforesaid rotating shaft by rotational driving force of the motor 55. Accordingly, the wafer transport means 54 is rotatable in the θ-direction.

On a transport base 56 of the wafer transport means 54, a plurality of, for example, two tweezers 57 and 58 for holding the wafer W are vertically provided. These tweezers 57 and 58 basically have the same structure and each have a shape and a size capable of freely passing through a side opening portion between both the wall portions 51 and 52 of the cylindrical supporter 53. Further, each of the tweezers 57 and 58 is movable back and forth by means of a motor (not shown) embedded in the transport base 56.

Figure 6:
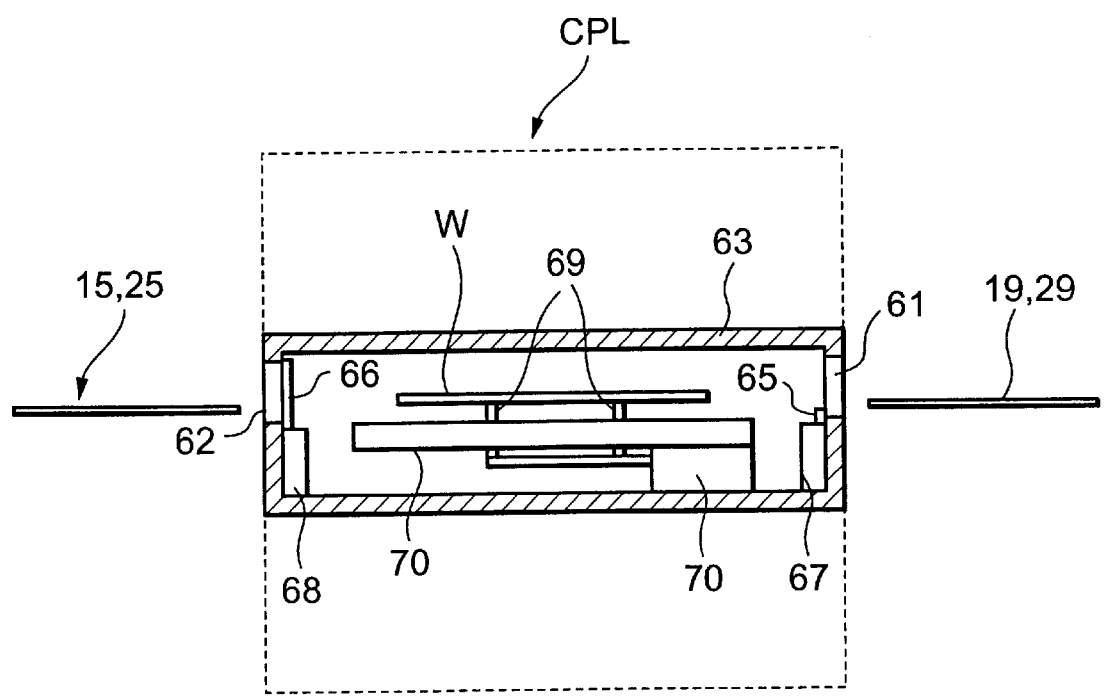
FIG. 6 is a sectional view showing the structure of a cooling processing unit shown in FIG. 2.

The aforesaid cooling processing unit (CPL) has a structure including a chill plate 64 for cooling the wafer W to a room temperature of about 23° C. in a casing 63 having a window portion 61 for transferring the wafer W to/from the main transport apparatus 19 or 29 and a window portion 62 for transferring the wafer W to/from the secondary transport apparatus 15 or 25 as shown in FIG. 6.

Shutter members 65 and 66 are disposed at the window portions 61 and 62 respectively to be capable of opening and closing. The shutter members 65 and 66 open and close the window portions 61 and 62 by drive of open/close driving sections 67 and 68. Further, a plurality of, for example, three support pins 69 for supporting the wafer W are arranged at the chill plate 64 to be capable of protruding and retracting from the front face of the chill plate 64. These support pins 69 are raised and lowered by a raising and lowering mechanism 70 disposed on the rear face side of the chill plate 64.

In the cooling processing unit (CPL) in this embodiment here, open/close drive of the shutter members 65 and 66 is performed so as not to bring about a state in which both the window portions 61 and 62 are opened. More specifically, the window portion 62 is closed by the shutter member 66 with the window portion 61 opened, and conversely, the window portion 61 is closed by the shutter member 65 with the window portion 62 opened. The open/close drive of the shutter members 65 and 66 is controlled, whereby the cooling processing unit (CPL) serves a function such as a load-lock chamber, with the result that temperature control in the processing solution supply unit (BCT, CT, DEV) for performing processing for the wafer W at a temperature close to room temperature can be performed more precisely.

Figure 7:
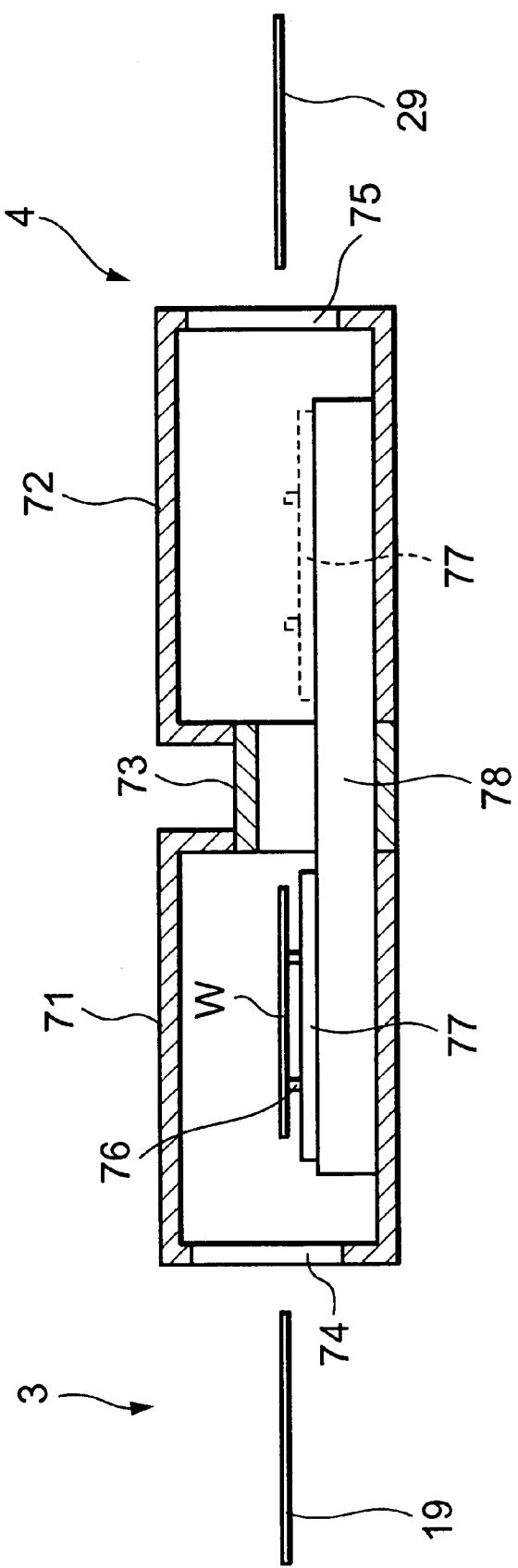
FIG. 7 is a sectional view showing the structure of a transfer unit shown in FIG. 3.

In the transfer units (STL) in the first and second processing stations 3 and 4, respective casings 71 and 72 communicate through a communicating passage 73 as shown in FIG. 7. Further, these casings 71 and 72 are respectively provided with opening portions 74 and 75 for transferring the wafer W to/from the main transport apparatuses 19 and 29 in the first and second processing stations 3 and 4. Furthermore, a holding plate 77 provided with a plurality of, for example, three support pins 76 for supporting the wafer W and a transfer mechanism 78 for transferring the holding plate 77 between the casing 71 and the casing 72 through the communicating passage 73 are provided in the casings 71 and 72.

The holding plate 77 in the state of being transferred in the casing 71 receives the wafer W from the main transport apparatus 19 in the first processing station 3, then is transferred to the casing 72 by the transfer mechanism 78, and delivers the wafer W to the main transport apparatus 29 in the second processing station 4. When the wafer is delivered from the second processing station 4 side to the first processing station 3 side, reverse operations are performed.

In this embodiment, the transfer units (STL) thus structured are provided, whereby deliver of the wafer W can be performed between the first processing station and the second processing station without burdening the main transport apparatuses 19 and 29.

Next, processing steps in the coating and developing processing system 1 thus structured will be explained.

In the coating and developing processing system 1, the unprocessed wafer W housed in the cassette C is taken out by the wafer transport body 11 in the cassette station 2, and then transported into the alignment unit (ALIM) in the first thermal processing unit group 20 of the first processing station 3 and subjected to alignment.

The wafer which has undergone the alignment in the alignment unit (ALIM) is transported into the cooling processing unit (CPL) in the cooling processing unit group 18 by the main transport apparatus 19 and subjected to cooling processing.

The wafer W which has undergone the cooling processing in the cooling processing unit (CPL) is transported into the anti-reflection film coating unit (BCT) in the anti-reflection film coating unit group 16 by the secondary transport apparatus 15 and coated with a processing solution for anti-reflection film.

The wafer W which has been coated with the processing solution for anti-reflection film in the anti-reflection film coating unit (BCT) is transported into the heat processing unit (HP) in the first thermal processing unit group 20 or the second thermal processing unit group 21 via the secondary transport apparatus 15, the cooling processing unit (CPL) in the cooling processing unit group 18, and the main transport apparatus 19 and subjected to heat processing.

The wafer W which has undergone the heat processing in the heat processing unit (HP) is transported into the cooling processing unit (CPL) in the cooling processing group 18 by the main transport apparatus 19 and subjected to cooling processing.

The wafer W which has undergone the cooling processing in the cooling processing unit (CPL) is transported into the resist coating unit (CT) in the resist coating unit group 17 by the secondary transport apparatus 15 and coated with a resist solution.

The wafer W which has been coated with the resist solution in the resist coating unit (CT) is transported into the heat processing unit (HP) in the first thermal processing unit group 20 or the second thermal processing unit group 21 via the secondary transport apparatus 15, the cooling processing unit (CPL) in the cooling processing unit group 18, and the main transport apparatus 19 and subjected to heat processing.

The wafer W which has undergone the heat processing in the heat processing unit (HP) is transported into the cooling processing unit (CPL) in the cooling processing group 18 by the main transport apparatus 19 and subjected to cooling processing.

The wafer W which has undergone the cooling processing in the cooling processing unit (CPL) is transported to the alignment unit (ALIM) in the second thermal processing unit group 31 via the main transport apparatus 19, the transfer units (STL) in the first and second processing stations 3 and 4, and the main transport apparatus 29 in the second processing station 4.

The wafer W which has been transported to the alignment unit (ALIM) in the second thermal processing unit group 31 is transported into the edge aligner 34 by the wafer transport body 35 in the interface section 5 and subjected to edge exposure.

The wafer W which has undergone the edge exposure in the edge aligner 34 is transported to the buffer cassette 33 by the wafer transport body 35 and then temporarily held or transported to the aligner (not shown) via the wafer transport body 35, the pre-exposure cooling unit 37, and the wafer transport body 38.

The wafer W which has undergone the exposure processing by means of the a ligner is transported from the interface section 5 to the alignment unit (ALIM) in the second thermal processing unit group 31 of the second processing station 4 via the wafer transport body 38, the buffer cassette 33, and the wafer transport body 35.

The wafer W which has been transported to the alignment unit (ALIM) is transported into the cooling processing unit (COL) in the cooling processing unit group 28 by the main transport apparatus 29 in the second thermal processing unit group 31 and subjected to cooling processing.

The wafer W which has undergone the cooling processing in the cooling processing unit (CPL) is transported to the developing processing unit (DEV) in the first or the second developing processing unit group 26 or 27 by the secondary transport apparatus 25 and subjected to developing processing.

The wafer W which has undergone the developing processing in the developing processing unit (DEV) is transported into the heat processing unit (HP) in the first thermal processing unit group 30 or the second thermal processing unit group 31 via the secondary transport apparatus 25, the cooling processing unit (CPL) in the cooling processing unit group 38, and the main transport apparatus 29 and subjected to heat processing.

The wafer W which has undergone the heat processing in the heat processing unit (HP) is transported to the alignment unit (ALIM) in the first thermal processing unit group 20 via the main transport apparatus 29, the transfer units (STL) in the first and second processing stations 3 and 4, and the main transport apparatus 19 in the first processing station 3.

The wafer W which has been transported to the alignment unit (ALIM) is housed in the cassette C by the wafer transport body 11 of the cassette station 2.

According to the coating and developing processing system 1 according to this embodiment structured as above, the first processing unit groups 13 and 23 and the second processing unit groups 14 and 24 in the first and second processing stations 3 and 4 are disposed in divided different areas, thereby minimizing thermal interference which the first processing unit groups 13 and 23 receive from the second processing unit groups 14 and 24. In addition, in the coating and developing processing system 1, the wafer W is not directly transferred between the first processing unit groups 13 and 23 and the second processing unit groups 14 and 24 but the transfer is performed only by means of the main transport apparatuses 19 and 29, thereby reducing the flow of a temperature atmosphere in the second processing unit groups 14 and 24 into the first processing unit groups 13 and 23 to a minimum. Consequently, temperature control in the first processing unit groups 13 and 23 for performing processing for the wafer W at a temperature close to room temperature can be precisely performed in the coating and developing processing system 1.

Further, according to the coating and developing processing system 1 according to this embodiment, the heat insulation walls 39 and the passages 40 for circulating the gas exhausted from the bottom portions of the first processing unit groups 13 and 23 to the top portions thereof are arranged between the first processing unit groups 13 and 23 and the second processing unit groups 14 and 24 in the first and second processing stations 3 and 4 respectively. Furthermore, the first processing unit groups 13 and 14 are divided from the second processing unit groups 14 and 24 by the heat insulation walls 39 and the passages 40, thereby preventing thermal interference from the second processing unit groups 14 and 24 to the first processing unit groups 13 and 23, and extremely precisely performing temperature control in the first processing unit groups 13 and 23 for performing processing for the wafer at a temperature close to room temperature.

The system configuration of the present invention is not limited to the aforesaid embodiment, and various configurations are conceivable within the technical meaning of the present invention.

Figure 8:
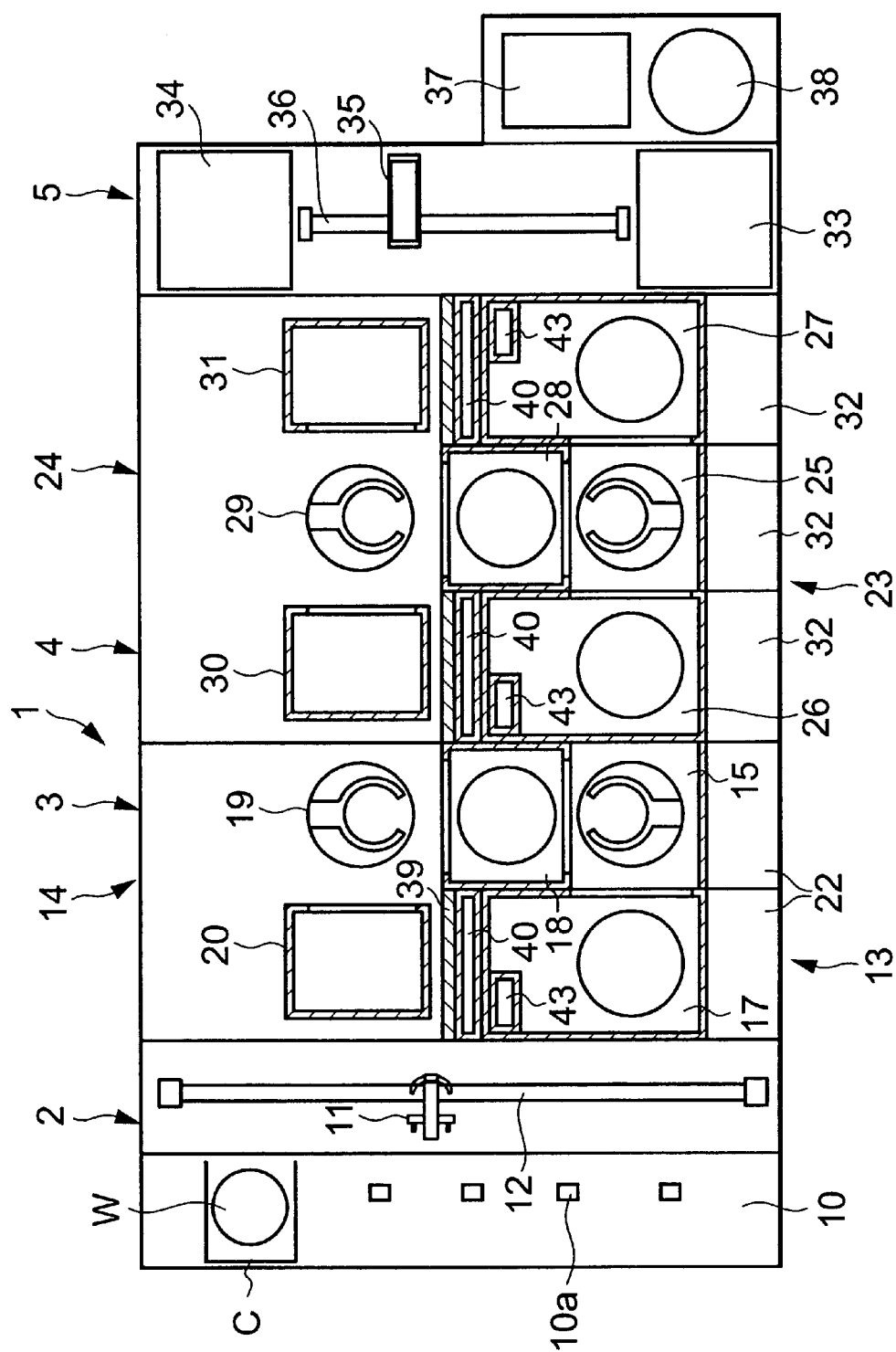
FIG. 8 is a plan view showing another system structure according to a second embodiment of the present invention.

For example, in the case where the step of applying the anti-reflection film is unnecessary, it is possible to have a configuration in which the anti-reflection film coating unit group and one of the processing unit groups in the first processing station 3 are omitted as shown in FIG. 8 as a second embodiment. This results in downsizing of the system and reduction in area of the first processing unit group 13 in the first processing station 3 in particular, so that temperature control of the resist film coating unit group 17 can be performed more precisely.

Figure 9:
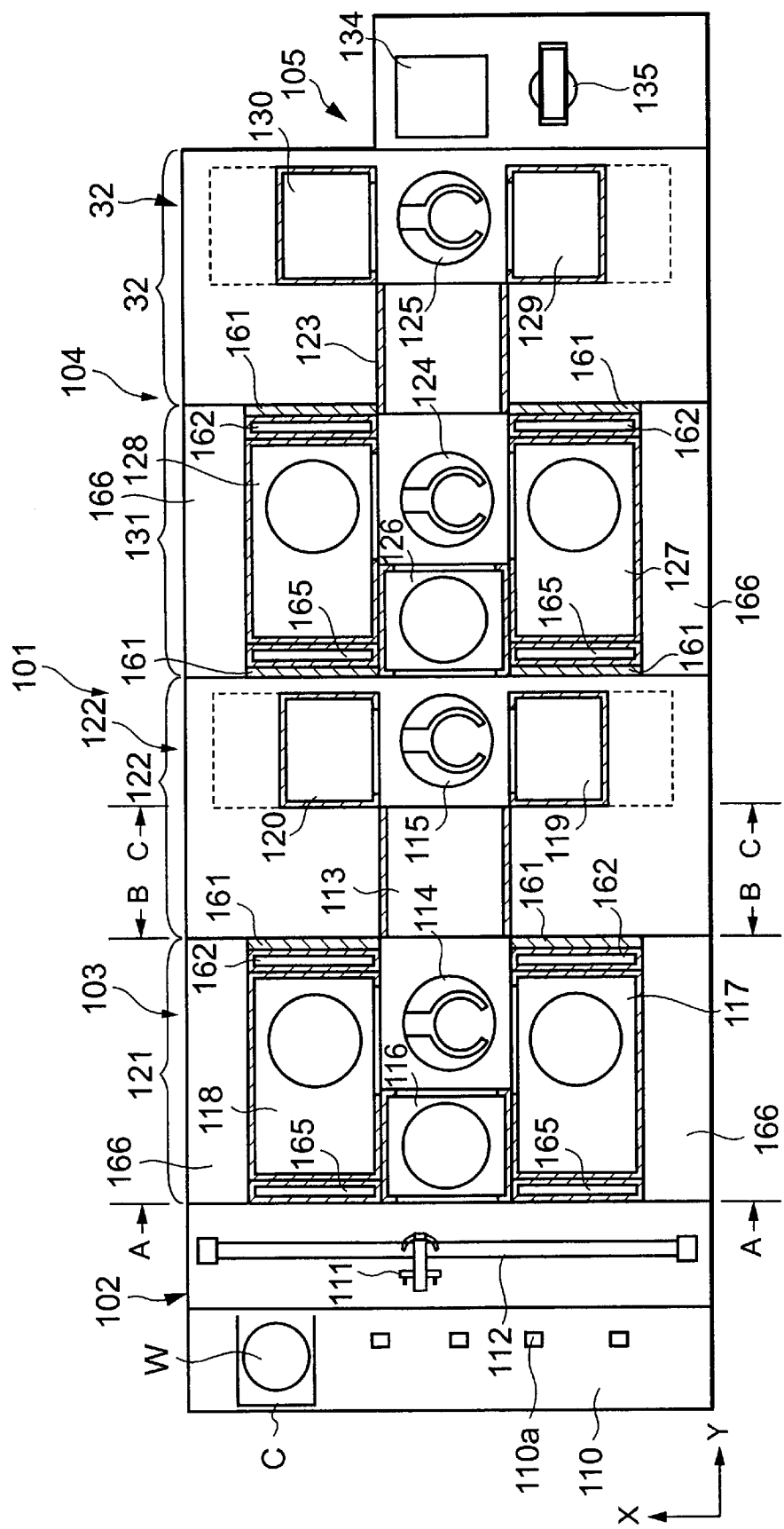
FIG. 9 is a plan view showing a coating and developing processing system according to a third embodiment of the present invention.
Figure 10:
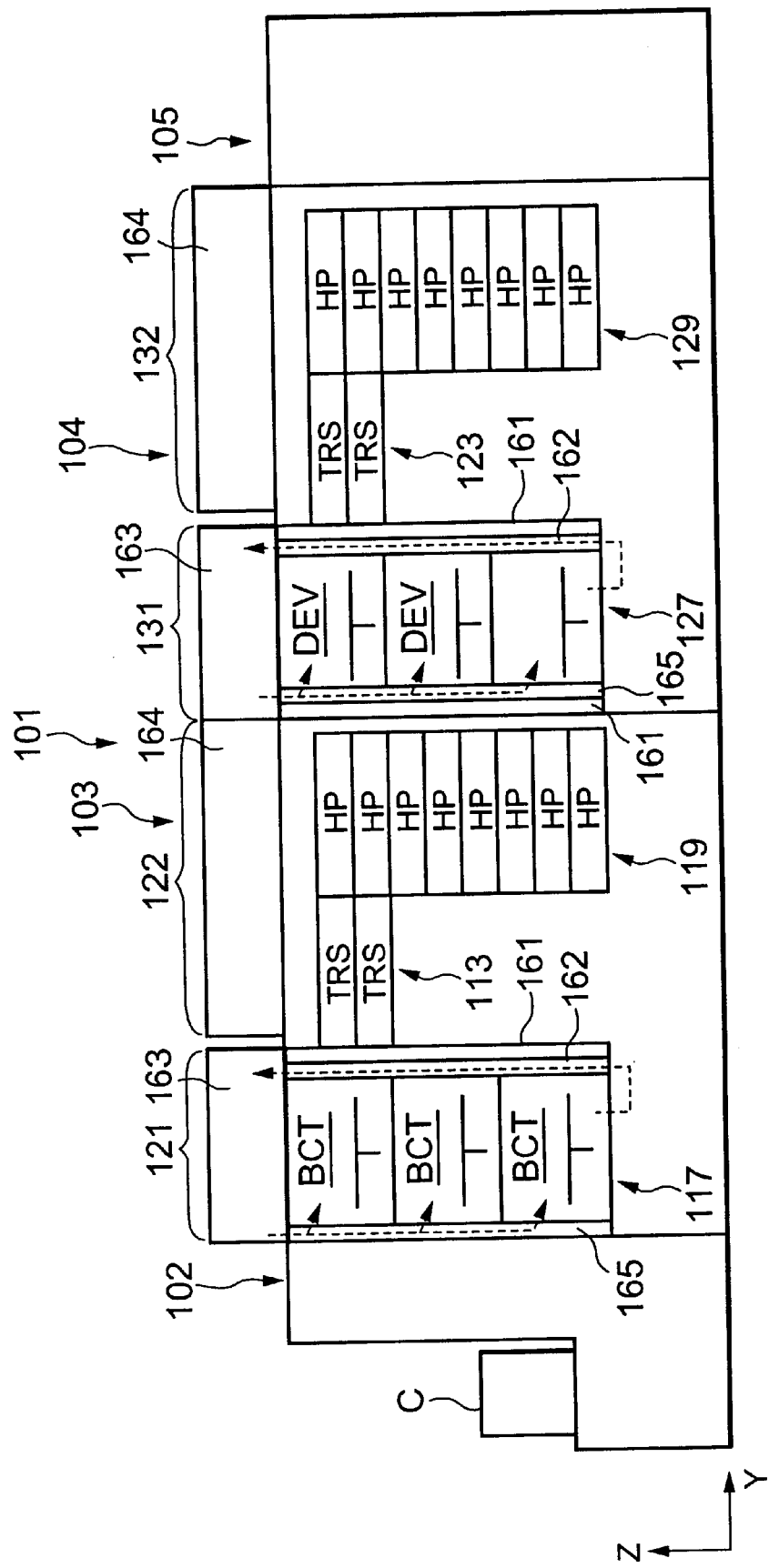
FIG. 10 is a front view of the coating and developing processing system shown in FIG. 9.
Figure 11:
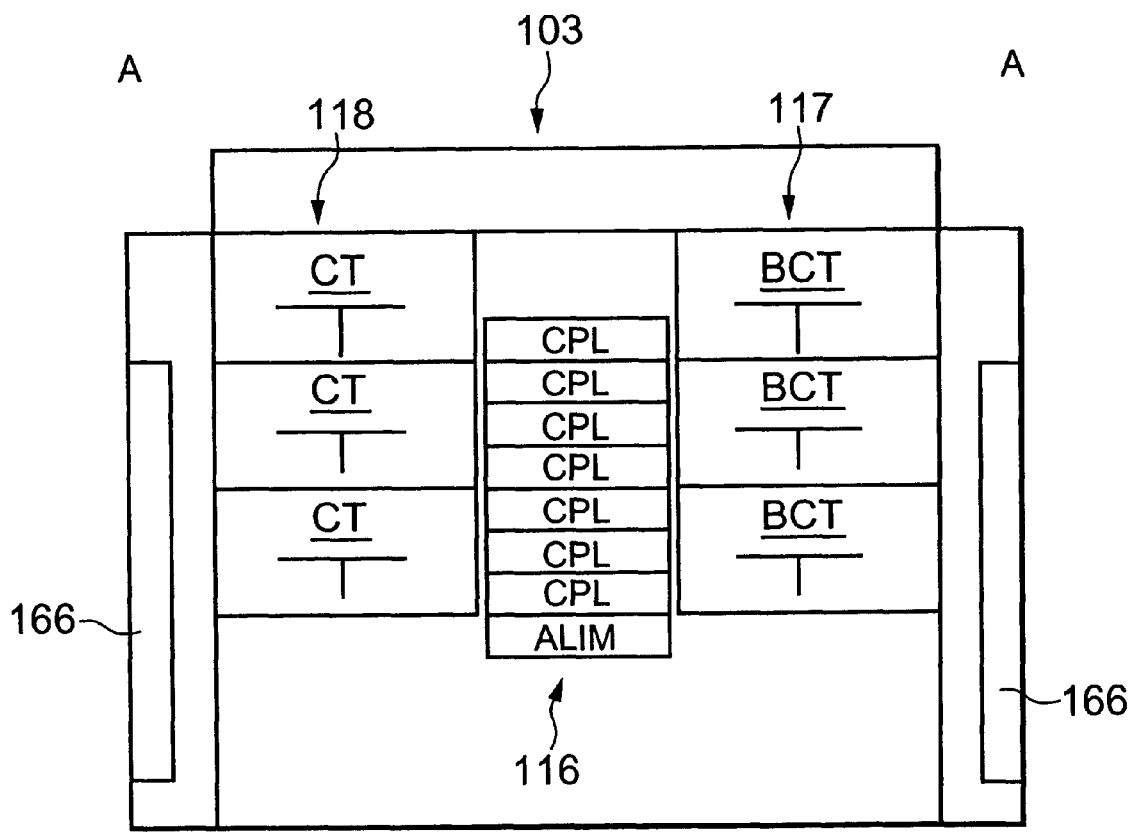
FIG. 11 is an A—A sectional view of the coating and developing processing system shown in FIG. 9.
Figure 12:
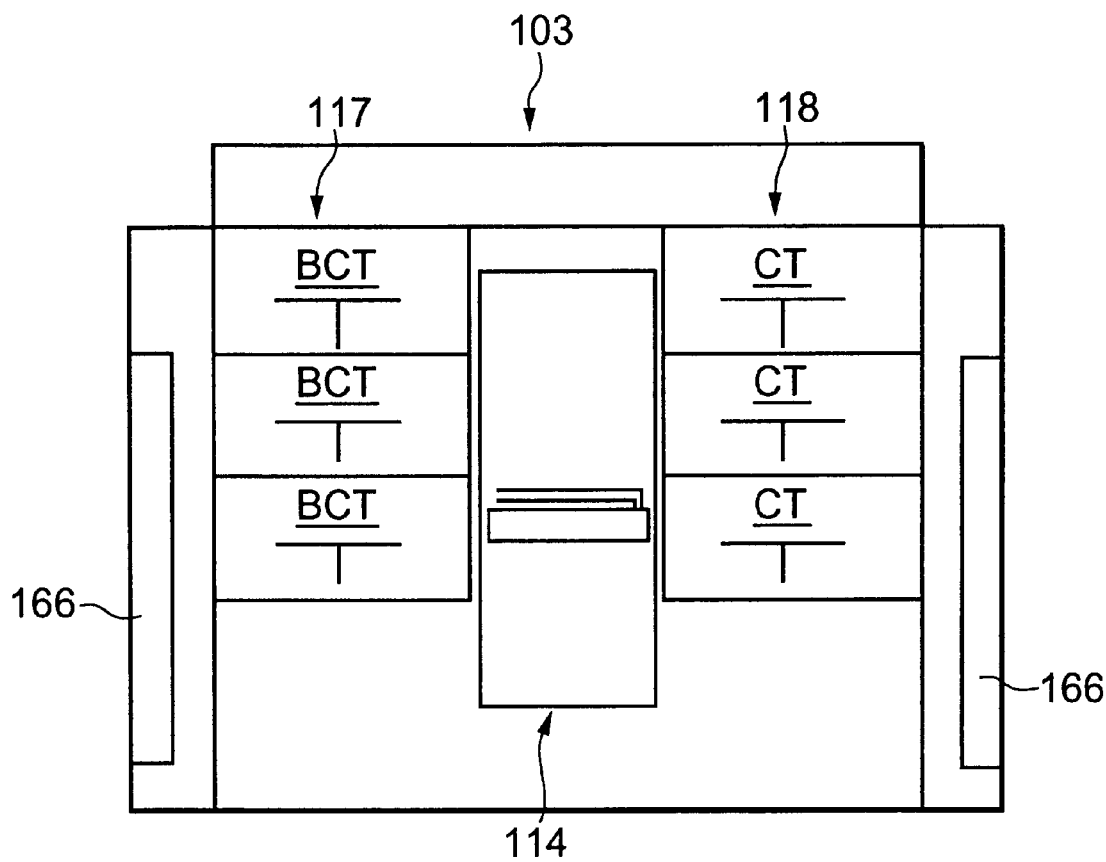
FIG. 12 is a B—B sectional view of the coating and developing processing system shown in FIG. 9.
Figure 13:
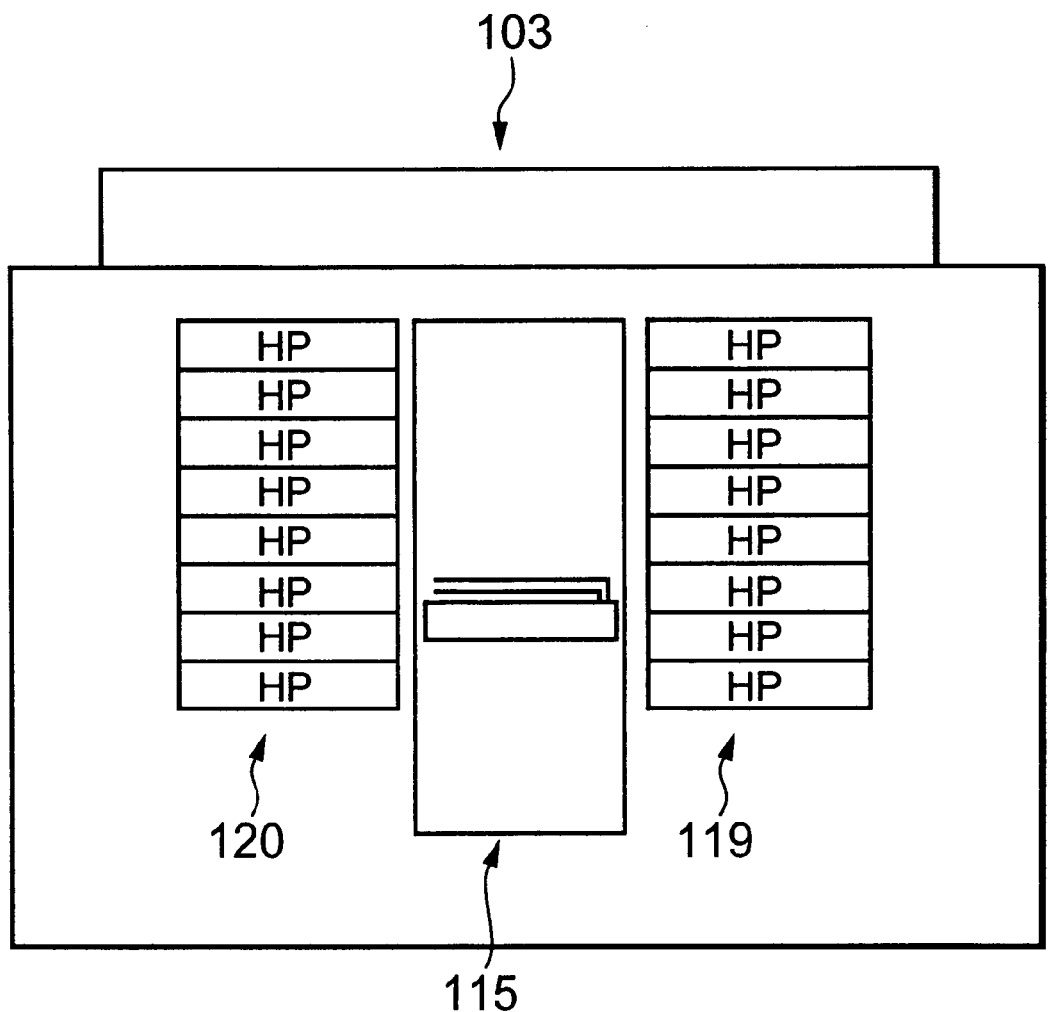
FIG. 13 is a C—C sectional view of the coating and developing processing system shown in FIG. 9.

Next, a third embodiment of the present invention will be explained. FIG. 9 to FIG. 13 are views showing a coating and developing processing system according to an embodiment of the present invention, FIG. 9 is a plan view, FIG. 10 is a front view, FIG. 11 is an A—A sectional view in FIG. 9, FIG. 12 is a B—B sectional view, and FIG. 13 is a C—C sectional view in FIG. 9.

As shown in FIG. 9, this coating and developing processing system 101 has a structure in which a cassette station 102 for transferring, for example, 25 wafers W, as a unit, from/to the outside into/from the coating and developing processing system 101 and carrying the wafer W into/out of a cassette C, a first processing station 103 in which various kinds of processing units each for performing predetermined processing for the wafers W one by one in coating and developing processing steps are multi-tiered, a second processing station 104 disposed adjacent to the first processing station and having almost the same structure as that of the first processing station, and an interface section 105 for transferring the wafer W to/from an aligner (illustration thereof is omitted) disposed adjacent to the second processing station 104 are integrally connected.

In the cassette station 102, a plurality of cassettes C can be mounted with respective wafer transfer ports facing the processing station 103 side at positions of positioning projections 110*a* on a cassette mounting table 110 in a line along an X-direction (a vertical direction in FIG. 9). A wafer transport body 111 movable in the direction of arrangement of cassettes C (the X-direction) and in the direction of arrangement of wafers W housed in the cassette C (a Z-direction: a vertical direction) can freely move along a transport path 112 and selectively gets access to each of the cassettes C.

The wafer transport body 111 is structured to be rotatable in a θ-direction so as to be accessible to an alignment unit in the first processing station 103 described later.

In the first processing station 103, a transfer table group 113 in which transfer tables (TRS) for transferring the wafer W are multi-tiered is disposed nearly at the center thereof, and a first transport apparatus 114 and a second transport apparatus 115 for transporting the wafer W are disposed in front and behind the transfer table group 113 to hold it therebetween.

In the first processing station 103, a cooling processing unit group 116, in which cooling processing units (CPL) for performing cooling processing for the wafer W are multi-tiered, is disposed to hold the first transport apparatus 114 between the cooling processing unit group 116 and the transfer table group 113. Further, on one side of the first transport apparatus 114, disposed is an anti-reflection film coating unit group 117 in which anti-reflection film coating units (BCT) for applying an anti-reflection film on the wafer W while the wafer W is mounted on a spin chuck in a cup to thereby perform anti-reflection film coating processing for the wafer W are multi-tiered. Furthermore, on the other side of the first transport apparatus 114, disposed is a resist coating unit group 118 in which resist coating units (CT) for applying a resist solution on the wafer W while the wafer W is mounted on a spin chuck in a cup to thereby perform resist coating processing for the wafer W are multi-tiered. The first transport apparatus 114, the cooling processing unit group 116, the anti-reflection film coating unit group 117, and the resist coating unit group 118 form a first area 121 for performing processing for the wafer W at room temperature.

Meanwhile, on both sides of the second transport apparatus 115, heat processing unit groups 119 and 120 in which heat processing units (HP) for performing heat processing for the wafer W are multi-tiered. The second transport apparatus 115 and the heat processing unit groups 119 and 120 form a second area 122 for performing heat processing for the wafer W.

Similarly, in the second processing station 104, a transfer table group 123 in which transfer tables (TRS) for transferring the wafer W are multi-tiered is disposed nearly at the center thereof, and a first transport apparatus 124 and a second transport apparatus 125 for transporting the wafer W are disposed in front and behind the transfer table group 123 to hold it therebetween.

In the second processing station 104, a cooling processing unit group 126, in which cooling processing units (CPL) for performing cooling processing for the wafer W are multi-tiered, is disposed to hold the first transport apparatus 124 between the cooling processing unit group 126 and the transfer table group 123. Further, on both sides of the first transport apparatus 124, disposed are developing processing unit groups 127 and 128 in each of which developing processing units (DEV) for supplying a developing solution to the wafer W while the wafer W is mounted on a spin chuck in a cup to thereby perform developing processing for the wafer W are multi-tiered. The first transport apparatus 124, the cooling processing unit group 126, the developing processing unit groups 127 and 128 form a first area 131 for performing processing for the wafer W at room temperature.

Meanwhile, on both sides of the second transport apparatus 125, heat processing unit groups 129 and 130 in which heat processing units (HP) for performing heat processing for the wafer W are multi-tiered. The second transport apparatus 125 and the heat processing unit groups 129 and 130 form a second area 132 for performing heat processing for the wafer W.

In the interface section 105, an edge aligner 134 is disposed on the rear face side thereof, and a wafer transport body 135 which is ascendable and descendable in the vertical direction and rotatable in the θ-direction is disposed on the front side thereof. The wafer transport body 135 is configured to get access to an alignment unit described later in the second processing station 104, the edge aligner 134, and the aligner (not shown).

As shown in FIG. 11, in the aforesaid cooling processing unit group 116 in the first processing station 103, an alignment unit (ALIM) for performing alignment of the wafer W and seven cooling processing units (CPL) are, for example, eight-tiered from the bottom in order. To the alignment unit (ALIM), transfer of the wafer W can be performed from both the wafer transport body 111 and the first transport apparatus 114. Therefore, an extra area for performing transfer of the wafer W between the first transport apparatus 114 and the cassette station 102 which is the outside seen from the first processing station 103 becomes unnecessary, thereby realizing space savings. It should be noted that the cooling processing unit group 126 in the second processing station 104 has the same structure as above. To the alignment unit (ALIM) in the cooling processing unit group 126, transfer of the wafer W can be performed from both the second transport apparatus 115 in the first processing station 103 and the first transport apparatus 124 in the second processing station 104.

As shown in FIG. 12, in the aforesaid anti-reflection film coating unit group 117 in the first processing station 103, anti-reflection film coating units (BCT) are three-tiered. Similarly, in the aforesaid resist coating unit group 118 in the first processing station 103, resist coating units (CT) are three-tiered. The first transport apparatus 114 is accessible to each unit in the anti-reflection film coating unit group 117 and the resist coating unit group 118 in addition to each unit in the cooling processing unit group 116. In each of the developing processing unit groups 127 and 128 in the second processing station 104, developing processing units (DEV) are two-tiered respectively, and the same access as above is possible.

As shown in FIG. 13, in the heat processing unit groups 119 and 120 of the first processing station 103, heat processing units (HP) are eight-tiered respectively, and the second transport apparatus 115 is accessible to each of these units. Also in the heat processing unit groups 129 and 130 of the second processing station 104, heat processing units (HP) are eight-tiered respectively, and the second transport apparatus 125 is accessible to each of these units.

Figure 14:
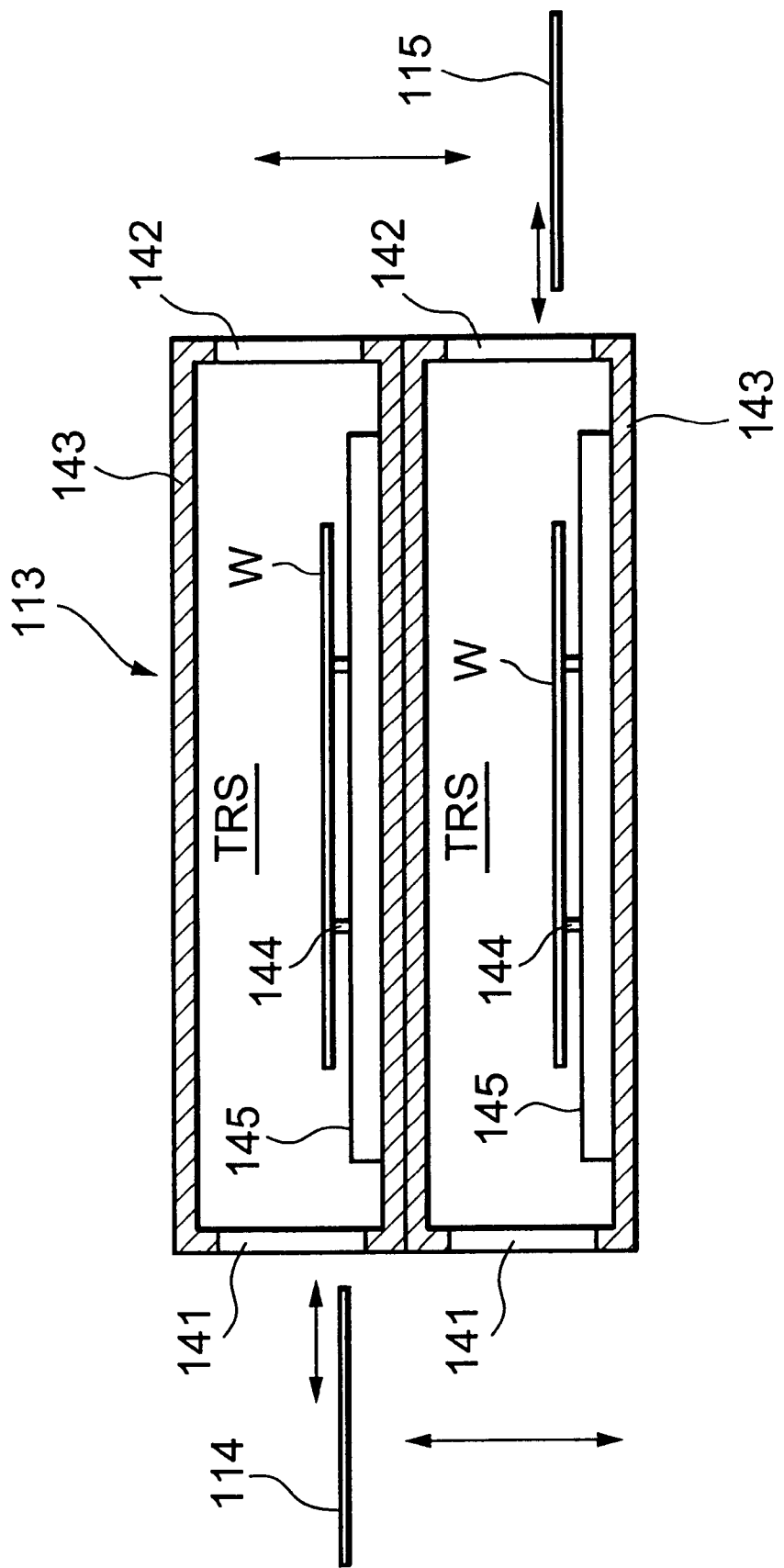
FIG. 14 is a sectional view showing the structure of a transfer table group in a first processing station in the third embodiment.

FIG. 14 is a sectional view showing the structure of the transfer table group 113 in the aforesaid first processing station 103.

In the transfer table group 113, transfer tables (TRS) are two-tiered. Each transfer table (TRS) includes a casing 143 provided with opening portions 141 and 142 for transferring the wafer W to/from the first transport apparatus 114 and the second transport apparatus 115. A transfer plate 145 provided with about three support pins 144 is disposed nearly at the center of the casing 143. It should be noted that the transfer table group 123 in the second processing station 104 is structured in the same manner as above.

The first and second transport apparatuses 114, 115, 124, and 125 in the first and second processing stations 103 and 104 have the structure shown in FIG. 5. As shown in FIG. 5, wafer transport means 54 which is ascendable and descendable in the vertical direction (the Z-direction) is provided inside a cylindrical supporter 53 composed of a pair of wall portions 51 and 52 which are connected with each other at respective upper ends and lower ends and face each other. The cylindrical supporter 53 is connected to a rotating shaft of a motor 55 and rotates integrally with the wafer transport means 54 around the aforesaid rotating shaft by rotational driving force of the motor 55. Accordingly, the wafer transport means 54 is rotatable in the θ-direction.

On a transport base 56 of the wafer transport means 54, a plurality of, for example, two tweezers 57 and 58 for holding the wafer W are vertically provided. These tweezers 57 and 58 basically have the same structure and each have a shape and a size capable of freely passing through a side opening portion between both the wall portions 51 and 52 of the cylindrical supporter 53. Further, each of the tweezers 57 and 58 is movable back and forth by means of a motor (not shown) embedded in the transport base 56.

As shown in FIG. 9 and FIG. 10, heat insulation walls 161 and passages 162 described later for circulating gas exhausted from the bottom portions of the first areas 121 and 131 to the upper portions thereof are arranged respectively on the heat processing unit group 119, 120, 129, and 130 sides of the anti-reflection film coating unit group 117 and the resist coating unit group 118 in the first processing station 103 and the developing processing unit groups 127 and 128 in the second processing station 104. In other words, the heat insulation walls 161 and the passages 162 are arranged to divide the first areas 121 and 131 from the second areas 122 and 132. Incidentally, insulation walls 161 are provided on the first processing station 103 side of the developing processing unit groups 127 and 128 in the second processing station 104.

First clean air supply sections 163 each for supplying temperature-controlled clean air from the top to the first area 121 or 131 and second clean air supply sections 164 each for supplying temperature-controlled clean air from the top to the second area 122 or 132 are disposed at the top portion of the coating and developing processing system 101.

The first clean air supply section 163 includes, for example, an FFU (a fan and filter unit), a temperature controller for controlling temperature and humidity, and the like, and supplies clean air, which is gas flowing thereinto through the passage 162 for circulating gas exhausted from the bottom portion of the first area 121 or 131 to the top portion thereof and controlled in temperature and humidity, and particles and the like are eliminated therefrom, to each of the coating processing units in the first area 121 or 131 through a passage 165.

Meanwhile, the second clean air supply section 164 includes, for example, an FFU (a fan and filter unit) and the like and supplies clean air, which is gas flowing thereinto through a passage (not shown) for circulating gas exhausted from the bottom portion of the second area to the top portion thereof and particles and the like are eliminated therefrom, to each heat processing unit (HP).

It is necessary to control temperature to room temperature in the first areas 121 and 131, whereas such temperature control is unnecessary in the second areas 122 and 132. Accordingly, supply of clean air to the first areas 121 and 131 and supply of clean air to the second areas 122 and 132 are separately performed, and only the clean airs to the first areas 121 and 131 are temperature-controlled, whereby cost of the temperature controller can be reduced, and more than that, the temperature control to the first areas 121 and 131 can be performed more precisely.

As a temperature controlling mechanism of the first clean air supply section 163, the following mechanism can be used. It is suitable to temperature-control clean air to a desired temperature by mixing new gas with a temperature lower than the temperature of the air to be supplied to each of the coating processing units (BCT, DEV) and the gas which has been exhausted from the bottom portion of the first area 121 or 131 and passed through the passage 162 in the first clean air supply section 163.

It should be noted that in the first areas 121 and 131, humidity management is necessary in addition to temperature management in the coating system of units, whereas humidity management is unnecessary in the cooling processing units. Thus, means for supplying clean air to the coating system of units and means for supplying clean air to the cooling processing units are separately provided, and only the clean air to the coating system of units is humidity-controlled, thereby further reducing cost of the temperature controller and enhancing effects in the precise temperature control.

Further, as shown in FIG. 9, FIG. 11 and FIG. 12, vessel shelves 166 as areas for housing vessels which store processing solutions used in the units, for example, a resist solution and an anti-reflection film solution are provided on both sides of the first areas 121 and 131, that is, on the sides of the anti-reflection film coating unit group 117 and the resist coating unit group 118 in the first processing station 103 and the developing processing unit groups 127 and 128 in the second processing station 104. The vessel shelf 166 has a structure like a door which can be opened and closed, for example, to the front side, and vessels can be housed in the door. This facilitates replacement of vessels and maintenance and checks.

Next, processing steps in the coating and developing processing system 101 thus structured will be explained.

In the coating and developing processing system 101, the unprocessed wafer W housed in the cassette C is taken out by the wafer transport body 111 of the cassette station 102, and then transported into the alignment unit (ALIM) in the cooling processing unit group 116 of the first processing station 103 and subjected to alignment.

The wafer W which has undergone the alignment in the alignment unit (ALIM) is transported into the cooling processing unit (CPL) in the cooling processing unit group 116 by the first transport apparatus 114 and subjected to cooling processing.

The wafer W which has undergone the cooling processing in the cooling processing unit (CPL) is transported into the anti-reflection film coating unit (BCT) in the anti-reflection film coating unit group 117 by the first transport apparatus 114 and coated with a processing solution for anti-reflection film.

The wafer W which has been coated with the processing solution for anti-reflection film in the anti-reflection film coating unit (BCT) is transported into the heat processing unit (HP) in the heat processing unit group 119 or 120 via the first transport apparatus 114, the transfer table (TRS) in the transfer table group 113, and the second transport apparatus 115 and subjected to heat processing.

The wafer W which has undergone the heat processing in the heat processing unit (HP) is transported into the cooling processing unit (CPL) in the cooling processing group 116 via the second transport apparatus 115, the transfer table (TRS) in the transfer table group 113, and the first transport apparatus 114 and subjected to cooling processing.

The wafer W which has undergone the cooling processing in the cooling processing unit (CPL) is transported into the resist coating unit (CT) in the resist coating unit group 118 by the first transport apparatus 114 and coated with a resist solution.

The wafer W which has been coated with the resist solution in the resist coating unit (CT) is transported into the heat processing unit (HP) in the heat unit group 119 or 120 via the first transport apparatus 114, the transfer table (TRS) in the transfer table group 113, and the second transport apparatus 115 and subjected to heat processing.

The wafer W which has undergone the heat processing in the heat processing unit (HP) is transported into the cooling processing unit (CPL) in the cooling processing group 126 via the second transport apparatus 115, the alignment unit (ALIM) in the cooling processing unit group 126 of the second processing station 104, and the first transport apparatus 124 and subjected to cooling processing.

The wafer W which has undergone the cooling processing in the cooling processing unit (CPL) is transported into the edge aligner 134 via the first transport apparatus 124, the transfer table (TRS) in the transfer table group 123, the second transport apparatus 125, the heat processing unit (HP) in the heat processing unit group 129, and the wafer transport body 135 and subjected to edge exposure.

The wafer W which has undergone the edge exposure in the edge aligner 134 is transported to the aligner (not shown) by means of the wafer transport body 135.

The wafer W which has undergone the exposure processing by the aligner is transported into any of the heat processing units (HP) in the heat processing unit groups 129 and 130 via the wafer transport body 135, the heat processing unit (HP) in the heat processing unit group 129, and the second transport apparatus 125 and subjected to heat processing.

The wafer W which has undergone the heat processing in the heat processing unit (HP) is transported into the cooling processing unit (CPL) in the cooling processing unit group 126 via the second transport apparatus 125, the transfer table (TRS) in the transfer table group 123, and the first transport apparatus 124 and subjected to cooling processing.

The wafer W which has undergone the cooling processing in the cooling processing unit (CPL) is transported to the developing processing unit (DEV) in the developing processing unit group 127 or 128 by the first transport apparatus 124 and subjected to developing processing.

The wafer W which has undergone the developing processing in the developing processing unit (DEV) is transported into the heat processing unit (HP) in the heat processing unit group 119 or 120 via the first transport apparatus 124, the alignment unit (ALIM) in the cooling processing unit group 126, and the second transport apparatus 115 in the first processing station 103 and subjected to heat processing.

The wafer W which has undergone the heat processing in the heat processing unit (HP) is transported to the alignment unit (ALIM) in the cooling processing unit group 116 via the second transport apparatus 115, the transfer table (TRS) in the transfer table group 113, and the first transport apparatus 114.

The wafer W which has been transferred to the alignment unit (ALIM) is housed in the cassette C by the wafer transport body 111 of the cassette station 102.

The coating and developing processing system 101 according to this embodiment structured as above is divided into the first areas 121 and 131 for performing processing for the wafer W at a temperature close to room temperature and the second areas 122 and 132 for performing heat processing for the wafer W with the transfer table (TRS) therebetween, and the first areas 121 and 131 and the second areas 122 and 132 can be separated by at least a width of the transfer table (TRS), thereby minimizing thermal interference which units for performing processing for the wafer W at a temperature close to room temperature in the first areas 121 and 131 receive from the second areas 122 and 132. Consequently, temperature control in the units for performing processing for the wafer W at a temperature close to room temperature can be precisely performed.

According to the coating and developing processing system 101 thus structured, the processing units and the like (the cooling processing unit group 116, the anti-reflection film coating unit group 117, the resist coating unit group 118, and the transfer table group 113 around the first transport apparatus 114 in the first processing station 103, and the cooling processing unit group 126, the developing processing unit groups 127 and 128, and the transfer table 123 around the first transport apparatus 124 in the second processing station 104) can be arranged on four sides around the first transport apparatuses 114 and 124. Further, the processing units and the like (the heat processing unit groups 119 and 120 and the transfer table group 113 around the second transport apparatus 115 in the first processing station 103 and the heat processing unit groups 129 and 130 and the transfer table group 123 around the second transport apparatus 125 in the second processing station 104) can be arranged on three sides around the second transport apparatuses 115 and 125, and the remaining one side (the side from the second transport apparatus 115 to the cooling processing unit group 126 in the second processing station 104) can be used for transfer of the wafer W to/from the outside, so that the processing units and the like can be densely arranged. Consequently, space savings can be realized.

It should be noted that the description is presented taking a wafer as an example of a substrate in the aforesaid embodiments, but the present invention can be applied to another substrate such as an LCD substrate or the like. Further, the present invention can be applied to not only a resist coating and developing processing system, but also another system, for example, an SOD (Spin on Dielectric) processing system for forming a layer insulating film on a substrate or the like.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
a first processing unit group including a plurality of first processing units for performing processing for a substrate at a temperature close to room temperature;
a second processing unit group including a plurality of second processing units for performing heat processing for the substrate; and
a main transport apparatus for transporting the substrate between the units,
wherein said first processing unit group and said second processing unit group are disposed in divided different areas, and the substrate is transferred between said first processing unit group and said second processing unit group only by means of said main transport apparatus; and
wherein a heat insulation wall is provided to divide an area in which said first processing unit group is disposed from an area in which said second processing unit group is disposed.

2. The apparatus as set forth in claim 1,
wherein said first processing unit group comprises a processing solution supply unit group in which processing solution supply units each for supplying a processing solution to the substrate at a temperature close to room temperature are multi-tiered, a cooling processing unit for performing cooling processing for the substrate to a temperature close to room temperature, and a vertical transport-type secondary transport apparatus for carrying in/out the substrate between the processing solution supply units and the cooling processing unit, so that the substrate is transferred to/from said main transport apparatus via the cooling processing unit.

3. The apparatus as set forth in claim 2,
wherein the cooling processing unit includes a window portion with a shutter for transferring the substrate to/from the secondary transport apparatus and a window portion with a shutter for transferring the substrate to/from said main transport apparatus, and
wherein said apparatus further comprises means for controlling the opening and closing of the window portions so that while one window portion is opened, the other window portion is closed.

4. The apparatus as set forth in claim 1, further comprising:
a first clean air supply section for supplying clean air to said first processing unit group; and
a second clean air supply section for supplying clean air to said second processing unit group are provided, only said first clean air supply section including a temperature controller for temperature-controlling clean air to a predetermined temperature.

5. The apparatus as set forth in claim 1, further comprising:
a first clean air supply section for supplying clean air to said first processing unit group is provided, said first clean air supply section exhausting gas from a bottom portion of said first processing unit group and circulating the exhausted gas to blast temperature-controlled gas from a top portion of said first processing unit group and including a passage for circulating gas exhausted from the bottom portion of said first processing unit group to the top portion thereof to divide an area in which said first processing unit group is disposed from an area in which said second processing unit group is disposed.

6. The apparatus as set forth in claim 5,
wherein in said first clean air supply section, gas with a temperature lower than a temperature of the clean air to be supplied to said first processing unit group and the exhausted gas are mixed to produce the clean air.

7. The apparatus as set forth in claim 1, further comprising:
an area, disposed adjacent to an area in which said first processing unit group is disposed and on the opposite side to an area in which said second processing unit group is disposed, for housing a vessel for storing a processing solution used in said first processing unit group.

8. A substrate processing apparatus, comprising:
a transfer table on which a substrate is to be placed;
a cooling processing unit that performs a cooling process on the substrate;
a processing solution supply unit that supplies a processing solution to the substrate;
a heating processing unit that performs a heat process on the substrate;
a first transport apparatus capable of moving the substrate to and from the transfer table and also capable of moving the substrate to and from the cooling processing unit;
a second transport apparatus capable of moving the substrate to and from the transfer table and also capable of moving the substrate to and from the heating processing unit;
wherein the cooling processing unit, the first transport apparatus, the transfer table and the second transport apparatus are aligned in a row and arranged in the order of: the cooling processing unit, the first transport apparatus, the transfer table and the second transport apparatus;
wherein the processing solution supply unit is disposed beside the first transport apparatus; and
wherein the heat processing unit is disposed beside the second transport apparatus.

9. The apparatus as set forth in claim 8,
wherein said processing solution supply units are multi-tiered, and said first transport apparatus is accessible to each of said multi-tiered processing solution supply units.

10. The apparatus as set forth in claim 8, further comprising:
a transfer unit, arranged in tier with said cooling processing unit, for transferring the substrate to/from the outside on the opposite side to said first transport apparatus.

11. The apparatus as set forth in claim 8, further comprising:
a first clean air supply section for supplying clean air to a first area composed of said first transport apparatus, said cooling processing unit, and said processing solution supply unit; and separately
a second clean air supply section for supplying clean air to a second area composed of said transfer table, said second transport apparatus, and said heat processing unit, only said first clean air supply section including a temperature controller for temperature-controlling clean air to a predetermined temperature.

12. The apparatus of claim 8, wherein said apparatus is divided into a first area composed of said first transport apparatus, said cooling processing unit, said processing solution supply unit and a second area composed of said transfer table, said second transport apparatus, and said heat processing unit, and further comprises a first clean air supply section for supplying clean air to the first area, and wherein said first clean air supply section exhausts gas from a bottom portion of the first area and circulates the exhausted gas to blast temperature-controlled gas from a top portion of the first area and includes a passage for circulating the exhausted gas from the bottom portion of the first area to the top portion thereof to divide the first area from the second area.

13. The apparatus as set forth in claim 12, wherein in said first clean air supply section, gas with a temperature lower than a temperature of the clean air to be supplied to the first area and the exhausted gas are mixed to produce the clean air.

14. The apparatus as set forth in claim 8, wherein said apparatus is divided into a first area composed of said first transport apparatus, said cooling processing unit, and said processing solution supply unit and a second area composed of said transfer table, said second transport apparatus, and said heat processing unit, a heat insulation wall being provided to divide the first area from the second area.

* * * * *